United States Patent
Wang et al.

(10) Patent No.: US 11,589,458 B2
(45) Date of Patent: Feb. 21, 2023

(54) CIRCUIT BOARD AND OPTICAL MODULE

(71) Applicant: HISENSE BROADBAND MULTIMEDIA TECHNOLOGIES CO., LTD., Shandong (CN)

(72) Inventors: Xinnan Wang, Shandong (CN); Jianwei Mu, Shandong (CN); Shiming Wang, Shandong (CN); Ting Gao, Shandong (CN); Jiaao Zhang, Shandong (CN)

(73) Assignee: HISENSE BROADBAND MULTIMEDIA TECHNOLOGIES CO., LTD., Qingdao (CN)

(*) Notice: Subject to any disclaimer, the term of this patent is extended or adjusted under 35 U.S.C. 154(b) by 378 days.

(21) Appl. No.: 16/626,305

(22) PCT Filed: Oct. 17, 2019

(86) PCT No.: PCT/CN2019/111714
§ 371 (c)(1),
(2) Date: Dec. 23, 2019

(87) PCT Pub. No.: WO2020/078432
PCT Pub. Date: Apr. 23, 2020

(65) Prior Publication Data
US 2021/0337662 A1   Oct. 28, 2021

(30) Foreign Application Priority Data

Oct. 17, 2018   (CN) .......................... 201811208050.3
Nov. 23, 2018   (CN) .......................... 201811403866.1

(51) Int. Cl.
*H05K 1/02* (2006.01)
*H05K 1/11* (2006.01)
(Continued)

(52) U.S. Cl.
CPC .......... *H05K 1/0298* (2013.01); *H01S 5/042* (2013.01); *H01S 5/40* (2013.01); *H05K 1/115* (2013.01);
(Continued)

(58) Field of Classification Search
CPC ...... H05K 1/0298; H05K 1/115; H05K 1/117; H05K 1/0253; H05K 2201/09336;
(Continued)

(56) References Cited

U.S. PATENT DOCUMENTS 8,194,412 B2   6/2012   Zhou et al.
9,699,901 B2   7/2017   Yao et al.
(Continued)

FOREIGN PATENT DOCUMENTS

CN   102056401 A   5/2011
CN   102548205 A   7/2012
(Continued)

OTHER PUBLICATIONS

First Chinese Office Action regarding Application No. 201811208050.3 dated Apr. 24, 2020. English translation provided by Chinable IP.
(Continued)

*Primary Examiner* — Ishwarbhai B Patel
(74) *Attorney, Agent, or Firm* — Harness, Dickey & Pierce, P.L.C.

(57) ABSTRACT

An optical module, including: a first laser and a first laser chip for driving the first laser; a second laser and a second laser chip for driving the second laser; and a multi-layer circuit board, including a surface layer, a reference layer, and an intermediate layer provided between the surface layer and the reference layer, where a first row of edge connector pins and a second row of edge connector pins are disposed in at least one surface layer; the first row of edge connector pins are disposed to be closer than the second row of edge connector pins to a side edge, of the multi-layer circuit board, that is provided with an edge connector; and a region, of the intermediate layer, that corresponds to a data signal line pin in the second row of edge connector pins is a hollow region.

18 Claims, 9 Drawing Sheets

(51) Int. Cl.
  *H05K 1/18* (2006.01)
  *H01S 5/042* (2006.01)
  *H01S 5/40* (2006.01)

(52) U.S. Cl.
  CPC .............. *H05K 1/117* (2013.01); *H05K 1/18* (2013.01); *H05K 1/0218* (2013.01); *H05K 1/0245* (2013.01); *H05K 1/0253* (2013.01)

(58) Field of Classification Search
  CPC ........ H05K 1/0245; H05K 2201/09236; H01S 5/042; H01S 5/40; H01S 5/0239; H01S 5/4025; G02B 6/42
  See application file for complete search history.

(56) References Cited

U.S. PATENT DOCUMENTS

| | | | |
|---|---|---|---|
| 10,271,403 B2* | 4/2019 | Zheng | F21V 29/83 |
| 2004/0016569 A1* | 1/2004 | Mix | H05K 1/117 |
| | | | 174/261 |
| 2006/0094267 A1 | 5/2006 | Li | |
| 2007/0130555 A1 | 6/2007 | Osaka | |
| 2007/0134953 A1* | 6/2007 | Morana | H05K 1/117 |
| | | | 439/76.1 |
| 2011/0094782 A1* | 4/2011 | Zhou | H05K 1/0253 |
| | | | 174/260 |
| 2014/0004720 A1 | 1/2014 | Yao et al. | |
| 2017/0135202 A1* | 5/2017 | Lam | H05K 1/0298 |
| 2018/0294885 A1* | 10/2018 | Zheng | F21V 23/005 |

FOREIGN PATENT DOCUMENTS

| | | |
|---|---|---|
| CN | 203015290 U | 6/2013 |
| CN | 105425350 A | 3/2016 |
| CN | 205408280 U | 7/2016 |
| CN | 206559719 U | 10/2017 |
| CN | 207939832 U | 10/2018 |
| CN | 109219240 A | 1/2019 |
| CN | 109511220 A | 3/2019 |

OTHER PUBLICATIONS

International Search Report and Written Opinion in Chinese regarding International Application No. PCT/CN2019/111714 dated Jan. 16, 2020.

First Chinese Office Action regarding Application No. 201811403866.1 dated Sep. 29, 2019. English translation provided by Chinable IP.

* cited by examiner

CIRCUIT BOARD AND OPTICAL MODULE

This application is the U.S. National Phase Application under 35 U.S.C. 371 of International Application No. PCT/CN2019/111714 filed on Oct. 17, 2019. This application claims priorities of the Chinese Application No. 201811208050.3, filed with the National Intellectual Property Administration on Oct. 17, 2018 and entitled "OPTICAL MODULE", and Chinese Application No. 201811403866.1, filed with the National Intellectual Property Administration on Nov. 23, 2018 and entitled "CIRCUIT BOARD AND OPTICAL MODULE", all of which are incorporated herein by reference in their entirety.

FIELD OF THE INVENTION

This application relates to the field of optical communication technologies, and in particular, to a circuit board and an optical module.

BACKGROUND OF THE INVENTION

An optical module may achieve a conversion between an optical signal and an electrical signal, and is of great importance in the field of optical communication.

In the field of high-speed data communications, due to a relatively large communication data volume, a circuit board having a multi-layer PCB (printed circuit board) design is relatively common. At present, a substractive process is usually employed in a manufacturing process of a multi-layer printed circuit board. To be specific, a conductive pattern is formed by removing excess copper clads on a raw copper-clad plate. The substractive process usually uses chemical corrosion. Chemical corrosion is carried out in a indiscriminate fashion, and therefore, the desired conductive pattern needs to be masked/protected. In this case, a layer of etching resists, that is, a circuit diagram protection layer, needs to be coated on the conductive pattern. The unprotected copper clads are then removed by corrosion. At present, a photoresist is usually used as a material for image resolving. The photoresist is a photosensitive material that is sensitive to a light with certain wavelength and undergoes a photochemical reaction with the light to form a polymer. After an image is selectively exposed by using a negative film, an image protection layer is formed by eliminating photoresists that are not polymerized by using a developer (for example, a sodium carbonate solution of 1%).

In addition, during a current process of manufacturing a multi-layer printed circuit board, an inter-layer conduction function is achieved by using a metallized via. Therefore, a punching operation is further required during the manufacturing process of the PCB, and a metallized electroplating operation needs to be performed on the via, thus finally achieving inter-layer conduction.

In a circuit board used by the optical module, a data signal trace between the multi-layer PCB boards sometimes needs to be traced between different layers. An edge connector (a golden finger, which is a finger-shaped conductive contact that is usually made of a conductive material such as gold or copper) in the optical module, serving as an electrical connector of the optical module, is usually provided at a surface layer of the multi-layer PCB board. Tracing between different layers is usually achieved by means of vias and the like. However, a multi-layer circuit board in the prior art has the following problems: if there are a lot of impedance discontinuities, a data signal transmitted in a data signal line will have a relatively worse impedance matching effects, and the like.

SUMMARY OF THE INVENTION

This application provides an optical module, including: a first laser chip and a first laser, the first laser chip being configured to drive the first laser; a second laser chip and a second laser, the second laser chip being configured to drive the second laser; and a multi-layer circuit board, including a surface layer, a reference layer, and an intermediate layer provided between the surface layer and the reference layer, wherein a first row of edge connector pins and a second row of edge connector pins are disposed in at least one surface layer; the first row of edge connector pins are disposed to be closer than the second row of edge connector pins to a side edge, of the multi-layer circuit board, that is provided with the edge connector; wherein a region, of the intermediate layer, that corresponds to a data signal line pin in the second row of edge connector pins is a hollow region.

Formation of the hollow region prevents a current backflow of the second row of edge connector pins through the intermediate layer, instead, a current backflow will take place via the reference layer that forms reference with respect to the second row of edge connector pins; this helps to improve an impedance matching effects of a data signal.

Optionally, an area of the hollow region is greater than or equal to an area of the corresponding second row of edge connector pins.

Optionally, a data signal connection line is provided on the intermediate layer, and a reference ground line is provided between the hollow region and the data signal connection line.

Optionally, hollow regions are provided at both sides of at least one data signal connection line, and a reference ground line is provided between each hollow region and the at least one data signal line.

Optionally, the surface layer is connected to the intermediate layer and the reference layer through vias.

Optionally, a via for connecting the surface layer and the reference layer passes through the intermediate layer, but is not electrically connected with the intermediate layer.

Optionally, the vias are disposed at intervals along an extension direction of an edge connector pin.

Optionally, the intermediate layer is provided with a data signal connection line and a corresponding connection terminal connected to the data signal connection line, the data signal connection line is connected to a via through the connection terminal, and a width of the connection terminal is greater than that of the data signal connection line.

Optionally, the data signal connection line on the intermediate layer is electrically connected to a data signal line pin in the first row of edge connector pins.

Optionally, a shape of the connection terminal is the same as that of the corresponding data signal line pin in the first row of edge connector pins.

Optionally, a width of the connection terminal is greater than or equal to ⅓ of a width of the corresponding data signal line pin in the first row of edge connector pins, and is smaller than or equal to the width of the corresponding data signal line pin in the first row of edge connector pins.

Optionally, the width of the connection terminal is half of the width of the corresponding data signal line pin in the first row of edge connector pins.

Optionally, in the multi-layer circuit board, two middlemost layers of circuit boards are designated as reference layers.

Optionally, the circuit board is an eight-layer board, two middlemost layers of circuit boards are designated as reference layers, and two intermediate layers are provided between each reference layer and the corresponding surface layer.

Optionally, the circuit board is a ten-layer board, two middlemost layers of circuit boards are designated as reference layers, and three intermediate layers are provided between each reference layer and the corresponding surface layer.

Optionally, a region, of the intermediate layer, that corresponds to a data signal line pin in the first row of edge connector pins is a hollow region.

Optionally, a region, of the intermediate layer, that corresponds to a data signal line pin in the first row of edge connector pins is a hollow region, and the connection terminal is arranged in the hollow region.

Optionally, a length of the connection terminal is smaller than that of the corresponding data signal line pin in the first row of edge connector pins.

Optionally, an area of the connection terminal is smaller than an area of the rest/remainder of the hollow region.

Designs, other objectives, and beneficial effects of the application will become more obvious and understandable by reading descriptions of preferable embodiments with reference to accompanying drawings.

BRIEF DESCRIPTION OF THE DRAWINGS

To describe the technical solutions in the embodiments of this application or in the prior art in a more clear way, the accompanying drawings required for describing the embodiments or the prior art will be briefly described hereinafter. Apparently, the accompanying drawings in the description below illustrate certain embodiments of this application, and other drawings may also be obtained by one of ordinary skills in the art according to these accompanying drawings without an effective effort.

DETAILED DESCRIPTION OF THE EMBODIMENTS

To make objectives, technical solutions, and advantages of this application more clear, the technical solutions in the embodiments of this application will be described in detail with reference to accompanying drawings in the preferable embodiments of this application. Throughout the accompanying drawings, same or similar numerals represent same or similar components or components having the same or similar functions. The described embodiments merely illustrate certain embodiments of this application, and are not all embodiments. The embodiments described below with reference to accompanying drawings are exemplary, and are intended for illustrative, non-restrictive purpose. All other embodiments derived by persons of ordinary skills in the art based on the embodiments of this application without an inventive effort will fall within the protection scope of this application. Hereinafter, the embodiments of this application are described in detail with reference to the accompanying drawings.

In the description of this application, it should be noted that unless otherwise explicitly specified and defined, the terms such as "mount", "connect", and "couple" should be understood in a broad sense. For example, a connection may be a fixed connection, or an indirect connection through an intermediary, or an internal communication between two elements, or an interaction relationship between two elements. Persons of ordinary skilled in the art may understand specific meanings of the foregoing terms in this application according to specific situations.

Figure 1:
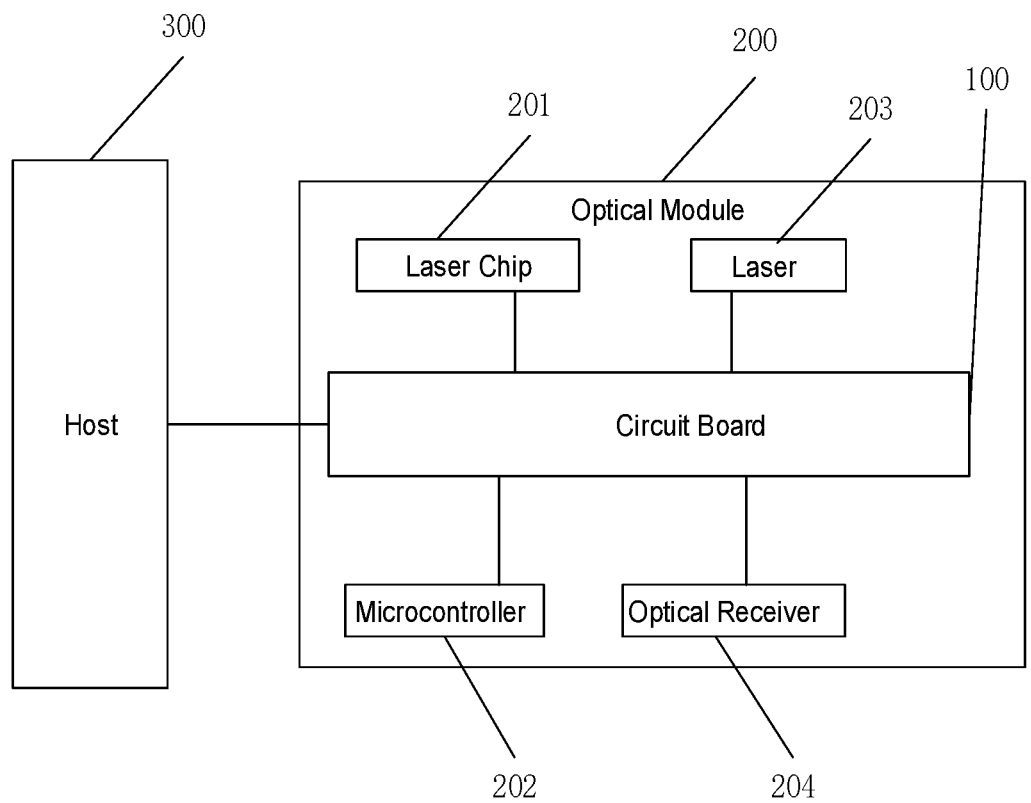
FIG. 1 is a schematic structural diagram of an optical module according to an embodiment of this application.

FIG. 1 is a schematic structural diagram of an optical module according to an embodiment of the application. An optical module 200 provided in the embodiments of this application includes a housing, at least two laser chips 201, at least two lasers 203, and a circuit board 100. The at least two laser chips 201, the at least two lasers 203, and the circuit board 100 are all located within the housing. A number of the lasers 203 is equal to that of the laser chips 201, and the lasers 203 are connected in one to one correspondence with the laser chips 201.

The optical module provided in this embodiment is configured to be connected to a host 300. The optical module may further include a microcontroller 202 and an optical receiver 204. An operation process of the optical module may include connecting the host 300 with the circuit board 100. Specifically, the circuit board 100 of the optical module 200 is electrically connected to the host by edge connectors.

In some embodiments of this application, the laser chips 201, the lasers 203, the microcontroller 202, and the optical receiver 204 are respectively connected to the circuit board.

The laser chips 201 obtain, via the circuit board, a first electrical signal sent by the host 300, and generate a corresponding drive signal. The drive signal is used to drive the lasers 203 to generate an optical signal. The optical receiver 204 obtains the optical signal and generates a second electrical signal, and sends the second electrical signal to the host 300 via the circuit board. The host 300 is connected to the microcontroller 202 via the circuit board 100, so as to obtain operation information of the optical module 200, and to adjust an operating status of the laser chips 201 through the microcontroller 202 according to the operation information.

The two lasers 203 and two laser chips 201 are disposed on a surface layer of the circuit board.

In some embodiments, the edge connector may be configured as a golden finger. The golden finger refers to a finger-shaped conductive contact that is made of a conductive material such as gold, copper, or silver. Edge connectors are usually disposed at an end portion of the circuit board. Edge connector pins in the edge connector are usually arranged in rows, and each row of edge connectors usually comprises a plurality of edge connector pins.

Figure 5:
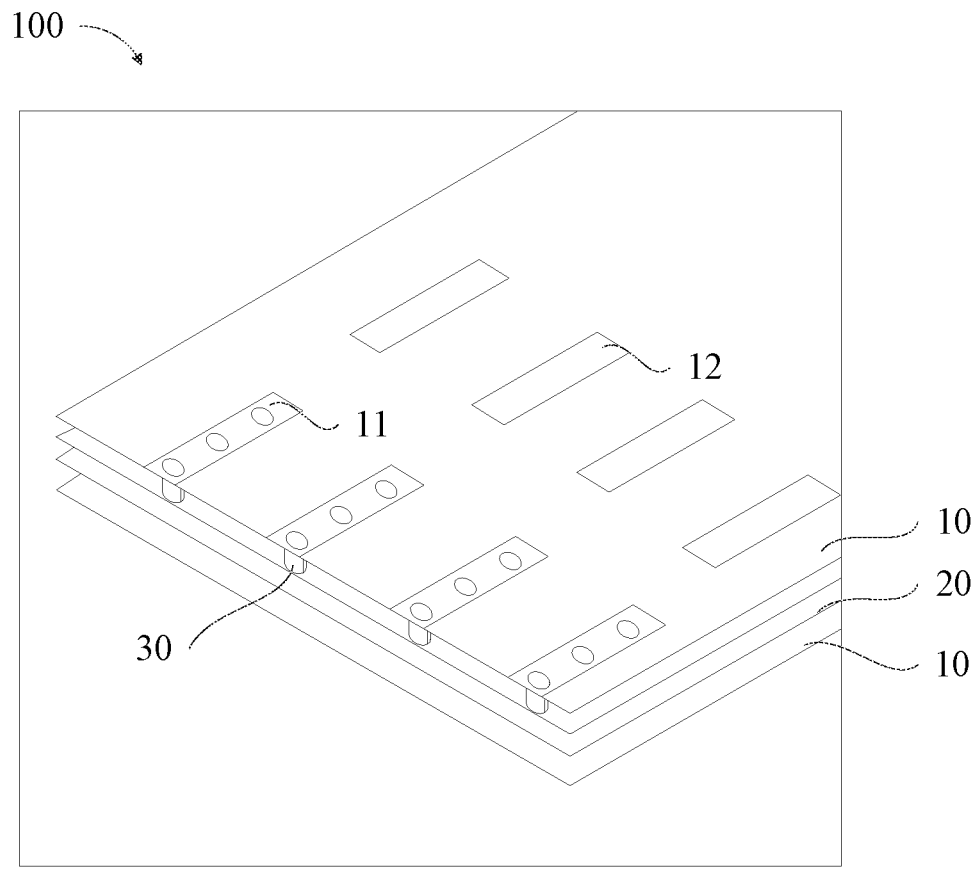
FIG. 5 is a schematic structural diagram of a circuit board according to an embodiment of this application.

In some embodiments, edge connector pins on a surface of the circuit board are disposed in two rows, that is, a first row of edge connector pins 11 and a second row of edge connector pins 12 (see for example FIG. 5).

Both the first row of edge connector pins and the second row of edge connector pins comprises data signal line pins.

In some embodiments, the data signal line pins in the two rows of edge connector pins may respectively correspond to two sets of laser chips and optical receivers. The at least two laser chips 201 include a first laser chip and a second laser chip. The first laser chip is electrically connected to the data signal line pins in the second row of edge connector pins 12 on a surface layer 10 of the circuit board 100 via connection lines at the surface layer 10. The first laser chip is electrically connected to the first laser. A data signal is transmitted to the first laser chip via the data signal line pin in the second row of edge connector pins 12. The first laser chip drives, based on the data signal, the first laser to emit light carrying the data signal.

The second laser chip is electrically connected to the second laser. A data signal is transmitted to the second laser chip via the data signal line pin in the first row of edge connector pins 11. The second laser chip drives, based on the data signal, the second laser to emit light carrying the data signal. The second laser chip is electrically connected to the data signal line pins in the first row of edge connector pins 11 on the surface layer 10 of the circuit board 100. Specifically, the second laser chip and the data signal line pins in the first row of edge connector pins 11 on the surface layer 10 of the circuit board 100 are respectively electrically connected to data signal lines of inner-layer connection lines provided on a certain inner layer through vias.

Figure 2:
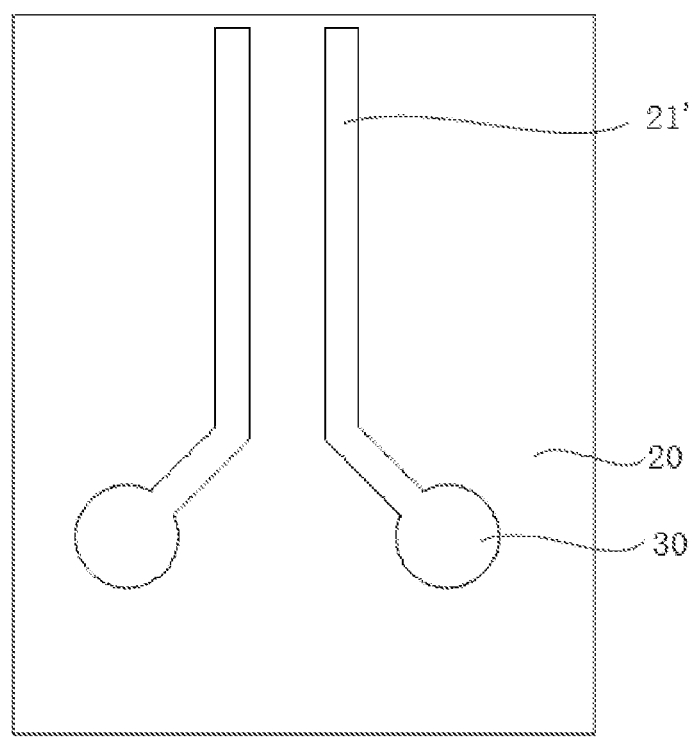
FIG. 2 is a schematic structural diagram of vias and connection lines on an inner PCB board according to an embodiment of this application.
Figure 3:
FIG. 3 is a TDR impedance graph according to an embodiment of this application.
Figure 4:
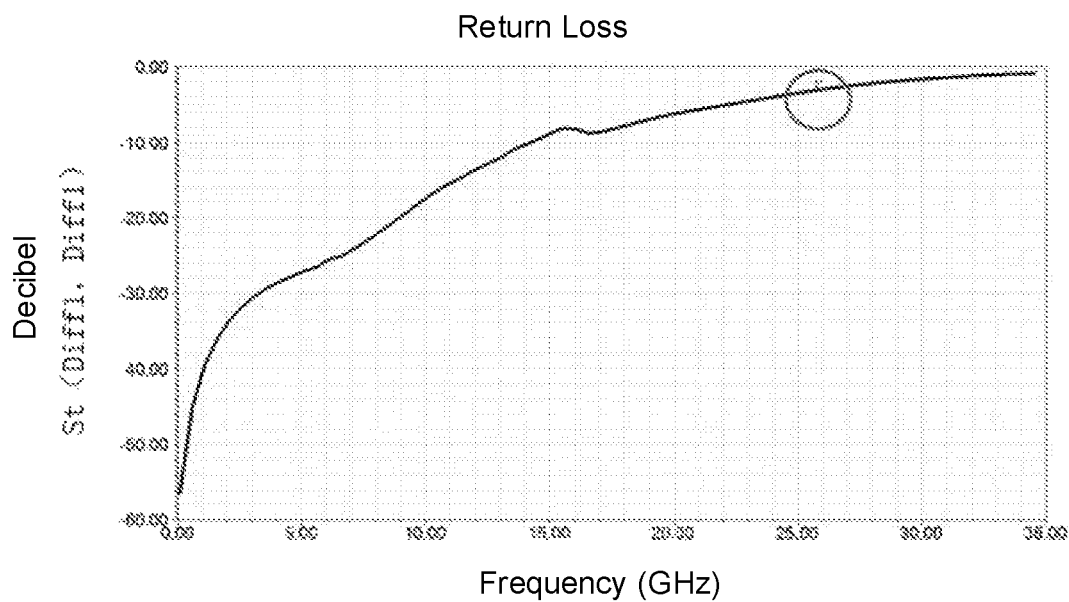
FIG. 4 is a return loss impedance graph according to an embodiment of this application.

Data signal lines of inner-layer connection lines (connection lines on an inner PCB board) are connected to the vias. FIG. 2 is a schematic structural diagram of vias and connection lines on an inner PCB board according to some embodiments of the present invention. FIG. 3 is a TDR impedance graph of the PCB board in FIG. 1. FIG. 4 is a return loss impedance graph of the PCB board in FIG. 1.

As stated above, there may be two rows of edge connector pins on the surface of the circuit board. Among which, the second row of edge connector pins 12 may be easily connected, at the surface layer, to traces on the surface layer. Data signal line pins in the first row of edge connector pins 11 are connected to traces on inner layer(s) of the circuit board through the vias.

At present, most PCB boards used in the field of high-speed data communications have a multi-layer structure, that is, include a plurality of metal layers for arranging signal lines. Dielectric layers are disposed between adjacent metal layers, so as to insulate the metal layers from one another. Multiple layers in the circuit board refer to the multiple metal layers for arranging connection lines, and they usually include surface layers that are respectively arranged at two opposite side surfaces of the PCB board and a plurality of inner layers disposed between two surface layers. Interlayer routing is inevitable when data signals are transmitted through PCB board. Such a transmission mode is also suitable for electrically connecting a device to edge connectors in an optical module. In signal transmission of interlayer routing, data signal lines at different layers are connected through vias, so that data signals may be transmitted to inner layers through the vias. When edge connector pins are used for transmitting data signals, though edge connector pins directly connected to traces at the surface layer may satisfy the requirements of the data signal, it is relatively difficult for edge connector pins that are routed through the vias to satisfy the requirements of the data signals, since data signals have high requirements on impedance matching of connection lines.

For example, as shown in FIG. 2, a connection line 21' at an inner layer is usually connected to a via 30 at a connection terminal. The via 30 is usually provided with a conductor that directly leads from the surface layer to the inner layer. Because an impedance value of the conductor in the via is not exactly the same as an impedance value of a conductor on the surface layer or the inner layer, a plurality of impedance discontinuity points may occur during the transmission process of the data signal. As a result, transmission quality of the signal is deteriorated, and signal integrity is also reduced. Refer to FIG. 3 and FIG. 4, for a TDR (Time-Domain Reflectometry) impedance curve and a return loss impedance curve that are obtained by testing impedance characteristics of the PCB board shown in FIG. 2, points circled out in FIG. 3 and FIG. 4 are impedance discontinuity points. It may be learned from these figures that, during the transmission process of the data signal, the PCB board has a plurality of impedance discontinuity points, resulting in an increasing return loss. Such a result indicates that the PCB board shown in FIG. 2 is unfavorable for transmitting data signals. When edge connector pins are used for transmitting data signals, though edge connector pins directly connected to traces at the surface layer may satisfy the requirements of the data signal, it is relatively difficult for edge connector pins that are routed through the vias to satisfy the requirements of the data signals, since data signals have high requirements on impedance matching of connection lines.

In the optical module, the surface layer of the multi-layer circuit board usually includes two rows of edge connector pins, that is, the first row of edge connector pins and the second row of edge connector pins, that are disposed in parallel. The surface layer and some of the inner layers may be provided with data signal lines that are used for transmitting data signals. Usually a reference backflow layer, that is, a reference layer, is disposed below the edge connector pin, to facilitate the transmission of data signals. Usually, the metal layer closest to the edge connector serves as the reference layer of the edge connector.

Figure 6:
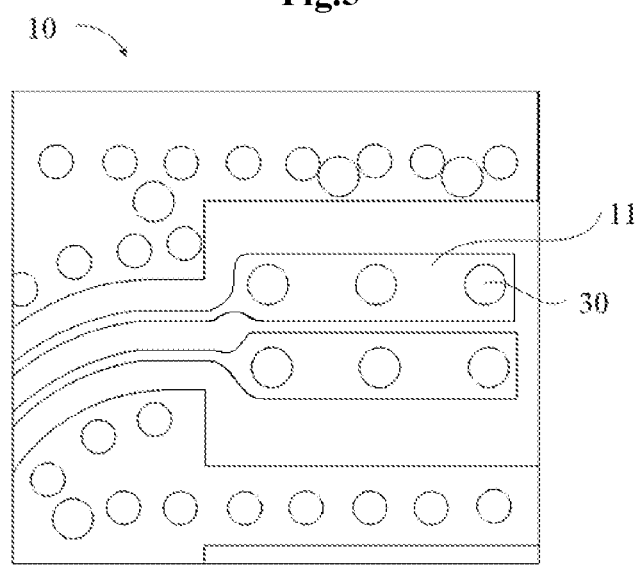
FIG. 6 is a schematic structural diagram of a pad of an edge connector of a surface PCB board of a circuit board according to an embodiment of this application.
Figure 7:
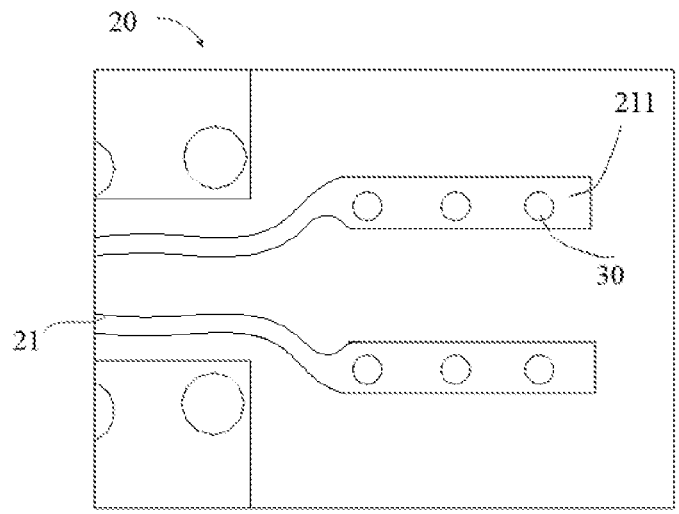
FIG. 7 is a schematic structural diagram of connection lines and vias of an inner PCB board of a circuit board according to an embodiment of this application.
Figure 8:
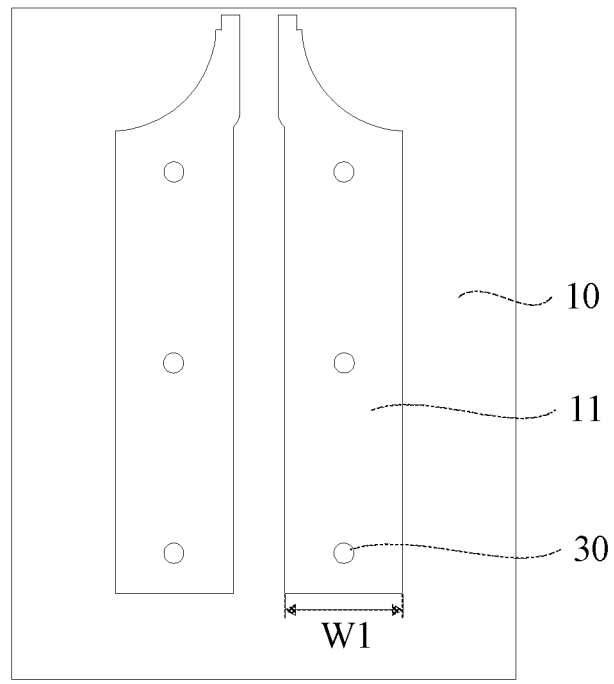
FIG. 8 is a schematic structural diagram of a surface PCB board of a circuit board according to an embodiment of this application.
Figure 9:
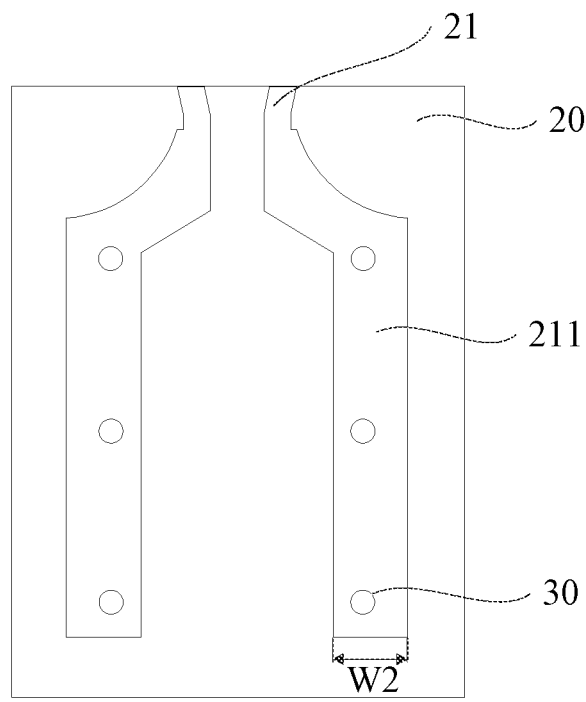
FIG. 9 is a schematic structural diagram of an inner PCB board of a circuit board according to an embodiment of this application.
Figure 10:
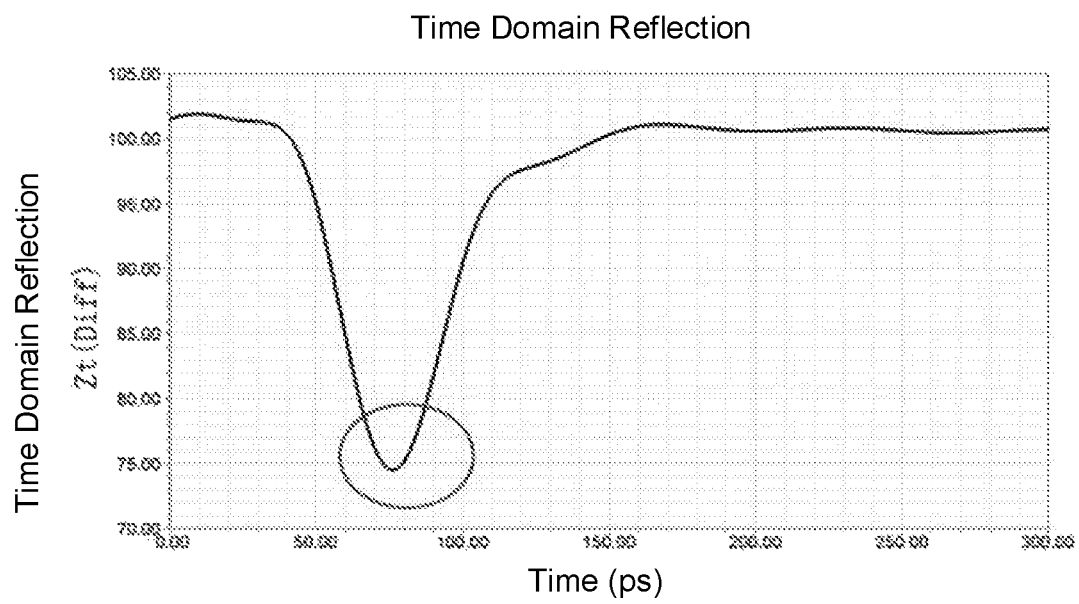
FIG. 10 is a TDR impedance graph of a circuit board according to an embodiment of this application.
Figure 11:
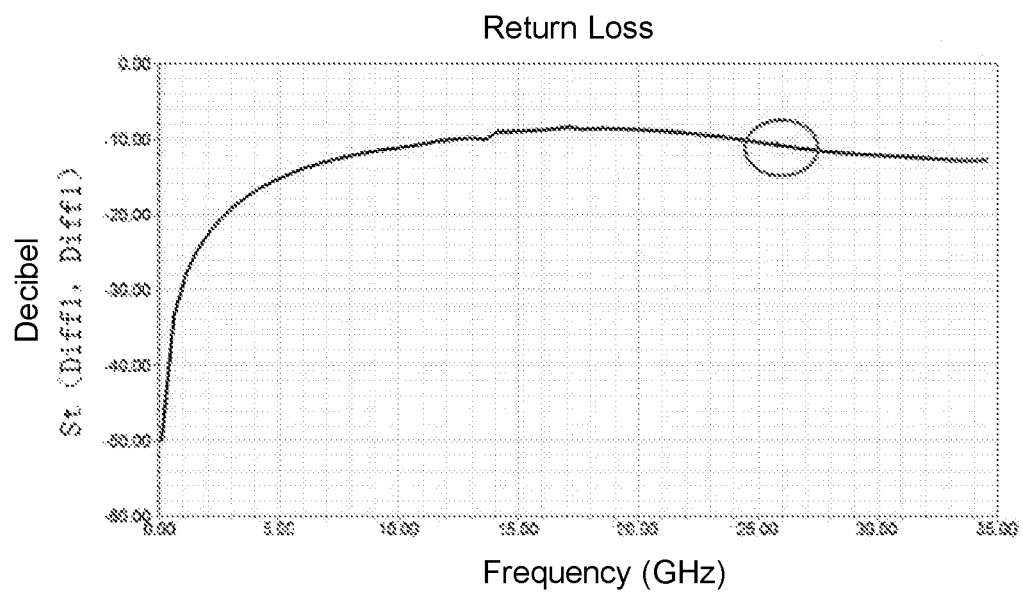
FIG. 11 is a return loss impedance graph of a circuit board according to an embodiment of this application.
Figure 12:
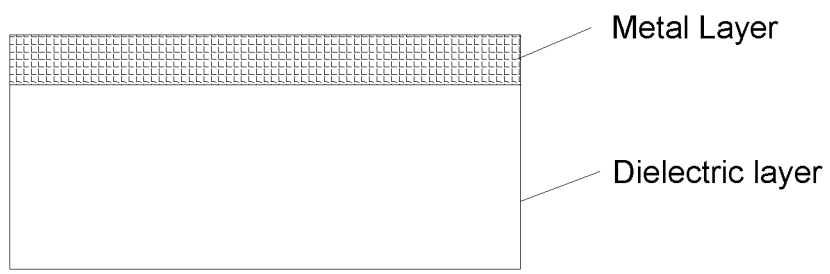
FIG. 12 is a schematic structural diagram showing one layer of a circuit board according to an embodiment of this application, wherein said layer includes a metal layer and a dielectric layer.
Figure 13:
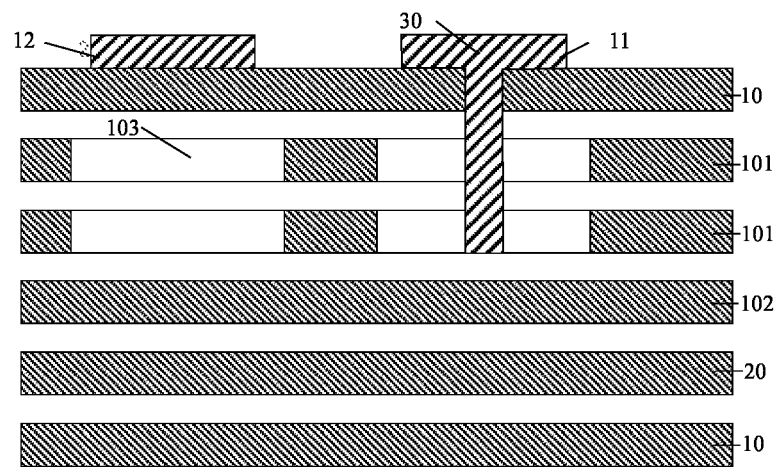
FIG. 13 is a schematic structural diagram of a circuit board according to an embodiment of this application, in which hollow regions are provided.
Figure 14:
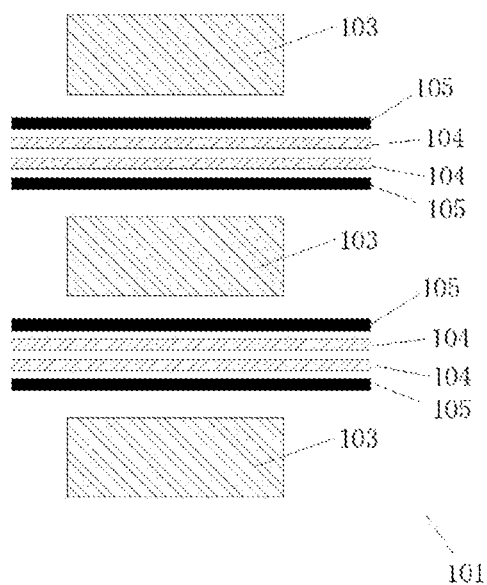
FIG. 14 is an enlarged schematic structural diagram of an intermediate layer having hollow regions according to an embodiment of this application.
Figure 15:
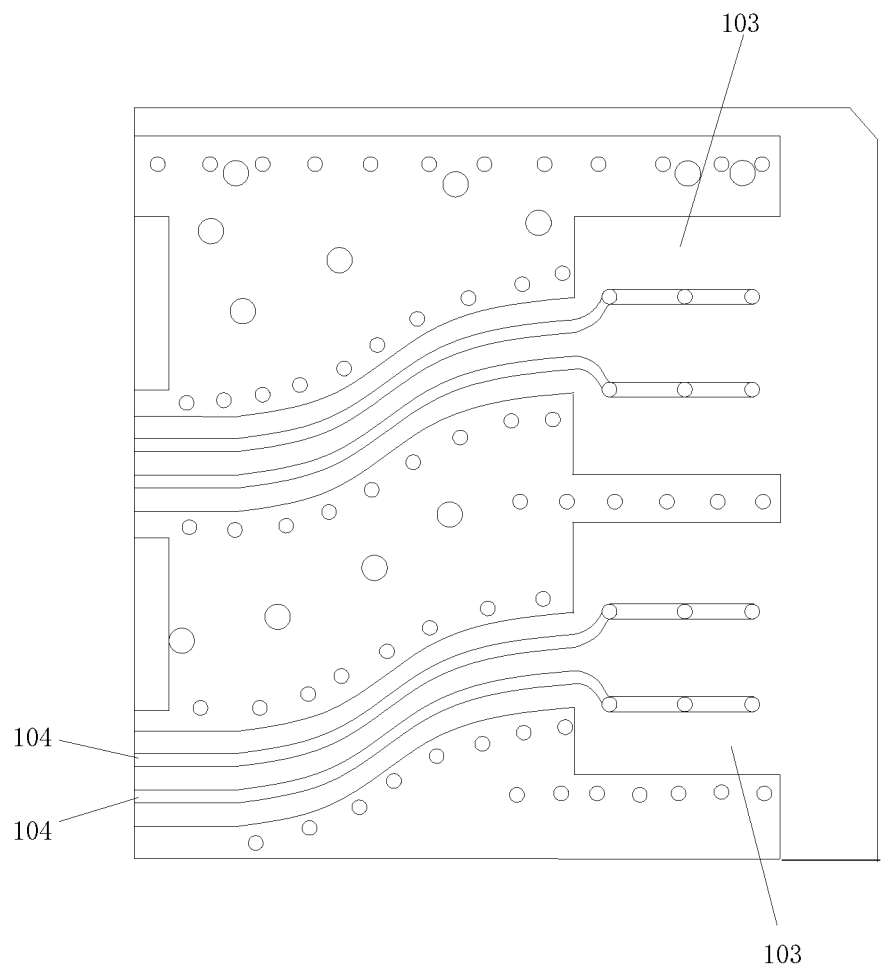
FIG. 15 is a schematic structural diagram of hollow regions below a first row of edge connector pins according to an embodiment of this application.

FIG. 5 is a schematic structural diagram of a circuit board according to an embodiment of this application. FIG. 6 is a schematic structural diagram of a pad of an edge connector of a surface PCB board of a circuit board according to an embodiment of this application. FIG. 7 is a schematic structural diagram of connection lines and vias of an inner PCB board of a circuit board according to an embodiment of this application. FIG. 8 is a schematic structural diagram of a surface PCB board of a circuit board according to an embodiment of this application. FIG. 9 is a schematic structural diagram of an inner PCB board of a circuit board according to an embodiment of this application. FIG. 10 is a TDR impedance graph of a circuit board according to an embodiment of this application. FIG. 11 is a return loss impedance graph of a circuit board according to an embodiment of this application. FIG. 12 is a schematic structural diagram showing one layer of a circuit board according to an embodiment of this application, wherein said layer includes a metal layer and a dielectric layer. FIG. 13 is a schematic structural diagram of a circuit board according to an embodiment of this application, in which hollow regions are provided. FIG. 14 is an enlarged schematic structural diagram of an intermediate layer having hollow regions according to an embodiment of this application. FIG. 15 is a schematic structural diagram of hollow regions below a first row of edge connector pins according to an embodiment of this application.

Specifically, as shown in FIG. 5 to FIG. 11, the circuit board 100 provided in an embodiment of this application includes a circuit board body. The circuit board body includes two surface layers 10 (that is, a top layer and a bottom layer) that are respectively located at two opposite surfaces of the circuit board body and inner layers 20 located between the two surface layers.

At least one (for example, the top layer) of the two surface layers 10 is provided with at least two rows of edge connector pins. The two rows of edge connector pins include a first row of edge connector pins 11 and a second row of edge connector pins 12 that are arranged in different rows. The second row of edge connector pins 12 are located between the first row of edge connector pins 11 and connection lines on the surface layer 10, and data signal line pins in the second row of edge connector pins 12 are connected to the connection lines on the surface layer 10. At least one inner layer 20 is provided with inner-layer connection lines 21 corresponding to respective data signal line pins in the first row of edge connector pins 11. The data signal line pins in the first row of edge connector pins 11 may be connected to the inner-layer connection lines through vias 30. The inner-layer connection lines are provided with connection terminals 211, and are connected to respective vias through corresponding connection terminals 211. An end portion, of the via 30, that is located on the inner layer 20 is connected to the connection terminal 211.

In some embodiments of this application, a width of the connection terminal 211 of a data signal line in inner-layer connection lines is greater than a width of the data signal line 21.

At the surface layer 10, the second row of edge connector pins 12 may be easily connected to the connection lines on the surface layer 10. Data connection line pins in the first row of edge connector pins 11 may be connected to respective data connection lines in the connection lines at the inner layer 20 of the circuit board 100 through vias 30.

It should be noted that, as shown in FIG. 5, the circuit board body of the circuit board 100 provided in some embodiments of this application has a multi-layer structure, that is, has two surface layers 10 that are respectively located at two opposite surfaces of the circuit board body and at least one inner layer 20 located between the two surface layers 10. The two surface layers 10 shown in the figure are respectively located above and below the inner layer 20. For ease of understanding, the surface layer located above the inner layer 20 in the figure is temporarily referred to as a top layer, and the surface layer located below the inner layer 20 is referred to as a bottom layer. It should be noted that in actual use, this way of expression may be adjusted according to an actual layout the circuit board. In other words, a relative positional relationship of the top layer and the bottom layer may be adjusted according to actual requirement. This is not limited to the figure, and is not limited to the embodiments.

In some embodiments, there are six inner layers 20 between the top layer and the bottom layer. For a structure of the circuit board body in other embodiments, a number of the inner layers 20 may be increased or decreased according to requirements. This is not limited in this application. For ease of line connection, at least two rows of edge connector pins are disposed on the surface layer 10. In addition, only two rows of edge connector pins are shown in FIG. 5. In actual use, the number of rows of edge connectors may be set according to requirements. This is also not limited in this application. At least two rows of edge connector pins include: data signal line pins in the second row of edge connector pins 12, that are used for connecting with respective connection lines arranged on the surface layer 10; and data signal line pins in the first row of edge connector pins 11, that are used for connecting with inner-layer connection lines 21. The first row of edge connector pins 11 and the second row of edge connector pins 12 are respectively provided in different rows. Moreover, the second row of edge connector pins 12 are located between the connection lines on the surface layer 10 and the first row of edge connector pins 11; the first row of edge connector pins 11 are closer to an outer edge of the circuit board; the second row of edge connector pins 12 are farther away from the outer edge of the circuit board than the first row of edge connector pins 11; and the data signal line pins in the second row of edge connector pins 12 may be closely connected to the connection lines on the surface layer of the circuit board.

Connection lines cannot be largely provided on the surface layer 10 because the surface layer 10 only has a limited space for arranging connection lines. In this case, some connection lines have to be disposed on inner layers 20 of the circuit board body. To ensure a smooth line connection and signal transmission between the inner layers 20 and the surface layer 10, a method called interlayer routing needs to be employed to guide connection lines or signals at the surface layer 10 to inner layers 20. The specific way of interlayer routing may be that: the top layer located in the above is connected to an inner layer 20 located below the top layer through a via 30. To be specific, the first row of edge connector pins 11 is disposed on the surface layer, and the data signal line pins in the first row of edge connector pins 11 may be connected to an end portion, of the via 30, that is located at the surface layer 10. Inner-layer connection lines are disposed on the inner layer 20. Data signal connection lines 21 in the inner-layer connection lines may be electrically connected to respective vias 30, so that data signals at the surface layer 10 may be transmitted to the inner-layer connection lines 21 through the first row of edge connector pins 11 and vias 30. In this way, an excessive layout of lines at the surface layer 10 may be avoided, and it is possible to take full advantage of the multi-layer structure of the circuit board 100.

In some embodiments, at least one of the plurality of inner layers 20 includes a reference layer.

In some embodiments, a data signal line pin in the first row of edge connector pins 11 is connected to a data signal connection line 21 at an inner layer of the circuit board through a plurality of vias 30.

In some embodiments, the plurality of vias 30 may be disposed at intervals along an extension direction of an edge connector pin in the first row of edge connector pins 11. A plurality of vias 30 may be provided, so as to effectively multiply signal transmission paths between the first row of edge connector pin 11 and the respective inner-layer connection lines 21, thus improving transmission quality of the data signal.

In some embodiments of this application, the extension direction of each edge connector pin is perpendicular to a layout direction of each row of connector pins.

In some embodiments of this application, a width of a corresponding connection terminal for at least one inner-layer connection line is set to be greater than a width of the corresponding inner-layer connection line.

In some embodiments of this application, a width of a connection terminal corresponding to at least one data signal connection line in inner-layer connection lines is set to be greater than a width of the data signal connection line.

In some embodiments of this application, widths of all connection terminals of respective data signal connection lines in inner-layer connection lines are set to be greater than a width of corresponding data signal lines.

To alleviate a problem of impedance discontinuity generated by vias 30, in some embodiments, a width of a connection terminal 211 of a data signal connection line in inner-layer connection lines 21 is set to be greater than the width of the data signal connection line. Setting the width of the connection terminal 211 to be greater than the width of the data signal line may further effectively increase a width of a connection region at which the data signal connection line is connected to the via 30. Such a setting may reduce a difference between the width of the data signal line pin at the surface layer 10 and the width of the inner-layer connection line, so as to avoid a region having relatively large impedance change during a transmission process of the data signal. Therefore, the number of impedance discontinuity points caused by such a region may be reduced. Further, problems such as reflections of data signals caused by impedance discontinuity points, and a consequent deterioration of signal transmission stability and signal integrity, and the like may be alleviated. A capacitance at the connection terminal may be increased by setting the width of the connection terminal that is connected to the end portion of the via at the inner layer to be greater than the width of the data signal line, such that a characteristic impedance of a microstrip structure may be reduced. In this way, the number of impedance discontinuity points in a signal transmission channel of the circuit board may be reduced, which is particularly advantageous for improving transmission quality of the data signal.

By increasing an area of the connection terminal, of the inner-layer connection line, that is connected to the via, phenomena of relatively large impedance changes and impedance discontinuity in a circuit board may be effectively reduced, so as to ensure a structural stability of a circuit during signal transmission, and to improve signal transmission efficiency and signal integrity.

A principle of how the width of the connection terminal 211 may influence signal impedance is described hereinafter with reference to accompanying drawings. As shown in FIG. 9, a width of the connection terminal 211 may be illustrated as the distance W2 in the figure. This distance may be a distance between two opposite side edges of the connection terminal 211, and is greater than a line width of the respective inner-layer connection line 21. Compared with a width of the inner-layer connection line 21, the width of the connection terminal 21 that is connected to the end portion of the via 30 is increased. According to a calculation formula for the characteristic impedance of a microstrip structure shown in the following formula (1), it may be learned that a line width W is in an inversely-proportional relationship to impedance Z. Therefore, an increase of a width of the connection terminal 211 of an inner-layer connection line 21 on an inner layer 20 may reduce impedance of the circuit board body, thus ensuring a moderate impedance change along a data signal transmission path, and reducing the number of impedance discontinuity points.

$$Z = \frac{87}{r} + 1.41\ln\frac{5.98H}{(0.8W+T)} \qquad (1)$$

Among which, Z represents the impedance of the microstrip structure, H represents a medium thickness, W represents the line width, T represents a line thickness, and r represents resistance per unit length.

In the circuit board 100 provided in this embodiment, after the data signal line pins in the first row of edge connector pins 11 of the circuit board 100 are connected to the data signal connection lines 21 in the inner-layer connection lines through a plurality of vias 30, the vias 30 will have a rated capacitance and inductance. When data signals transmit through the vias 30, under the influenced of the capacitance of the via 30, the impedance will be decreased, resulting in a voltage drop of the data signal, i.e., so called capacity effect. On the other hand, under the influenced of the inductance of the via, the impedance will be increased, resulting in a voltage rise of the data signal, i.e., so called inductance effect. When a current keeps constant, the voltage drop will cancel out the voltage rise, that is, the capacity effect will cancel out the impedance effect. In this case, a magnitude of voltage variation of the data signal will be kept constant. Such a setting may reduce the number of impedance discontinuity points, so as to ensure higher signal integrity of the data signal in the transmission channel.

As shown in FIG. 10 and FIG. 11, points that are circled out in FIG. 10 and FIG. 11 are points with impedance discontinuity. After the structure of the circuit board 100 is optimized, the number of impedance discontinuity points of the circuit board 100 is remarkably reduced, from four impedance discontinuity points in FIG. 3 to one impedance discontinuity points in FIG. 10. Moreover, compared with the return loss curve in FIG. 4, the return loss (FIG. 11) in this embodiment tends to be reduced during the process, indicating that the circuit board 100 provided in this embodiment can effectively alleviate the problem of relatively large number of impedance discontinuity points during signal transmission, and effectively alleviate the problem of an energy loss and reflections during signal transmission.

On the basis of the foregoing descriptions, one may become clear that the width of a connection terminal 211 is set to be greater than that of the respective inner-layer connection line 21, that is, compared with an inner-layer connection line 21' in prior art, the area of the connection terminal 211 that is connected to the via 30 is increased. A way to increase this area may be realized by further providing pads at the connection terminal 211 of the inner-layer connection line 21 of the inner layer 20. A material for manufacturing the pads may be the same as that of the first row of edge connector pins 11 at the surface layer 10. For example, the pad may be any one of a copper pad, an aluminum pad, or a copper-coated aluminum pad. To ensure stability of signal transmission during interlayer routing between the surface layer 10 and the inner layer 20, the vias 30 at the first row of edge connector pins 11 on the surface layer 10 are correspondingly connected in one-to-one correspondence to the vias 30 at the connection terminal 211 on the inner layer 20, with the number of the vias being the same with each other.

In some embodiments, the foregoing connection manner between the top layer and the inner layer 20 is also suitable for a connection between the bottom layer and the inner layer 20.

In some embodiments, in actual use, the specific number of the vias 30 may be set according to actual requirements. However, in this embodiment, the specific number of the vias 30 is not limited to the foregoing description. Specifically, in this embodiment, both FIG. 8 and FIG. 9 show a structure in which three vias 30 are disposed between a data signal pin in the first row of edge connector pins 11 and a corresponding inner-layer connection line 21.

A plurality of vias 30 for connecting a data signal line pin in the first row of edge connector pins 11 and an inner-layer connection line may be disposed at intervals along the extension direction of the first row of edge connector pins 11. Such a way of arrangement may effectively utilize a layout space of the first row of edge connector pins 11, so as to reasonably allocate layout positions of the vias 30. A spacing distances between adjacent vias 30 is not limited in this embodiment.

In some embodiments, the surface layer 10 of the circuit board 100 is connected with other signal transmission apparatus. Therefore, being affected and limited by a communication protocol therebetween, lengths, widths, and layout positions of the first row of edge connector pins 11 and the second row of edge connector pins 12 at the surface layer 10 usually need to be adjusted according to the communication protocol of the circuit board, and shall not change after the communication protocol is determined. However, the inner-layer connection lines 21 on the inner layer 20 will not be limited by the communication protocol. Therefore, shapes and layout positions of the inner-layer connection lines 21 may be set according to actual requirements.

In some embodiments, inner diameters of the vias 30 may be set in the following way: the inner diameters of all vias 30 are equal everywhere from an end close to the first row of edge connector pins 11 to an end close to the connection terminal 211, and the vias 30 with an uniform inner diameter can avoid an impedance varying region when the data signal is transmitted in the vias 30, so as to prevent the data signal from being reflected, thereby improving a transmission efficiency and integrity of the data signal.

In some embodiments, the width of the connection terminal 211 is greater than or equal to ⅓ of the width of the corresponding data signal line pin in the first row of edge connector pins 11, and is smaller than or equal to the width of the corresponding data signal line pin in the first row of edge connector pins 11. A width of the edge connector pin refers to a size of a single edge connector in a layout direction of the whole connector row. In an inner PCB board 20, the width of the connection terminal 211 is smaller than or equal to the width of the corresponding data signal line pin in the first row of edge connector pins 11. Such setting ensures that the connection terminal 211 can at least completely cover connection region, of the vias 30, at the connection terminal 211, so as to relieve a problem of impedance discontinuity generated when a signal in the via 30 is transmitted to the inner layer 20. Setting the width of the connection terminal 211 to be greater than or equal to ⅓ of the width of the corresponding data signal line pin in the first row of edge connector pins 11 can ensure that: compared with an connection terminal in the prior art, the connection area of the present invention may be increased, so as to reduce impedance of the circuit board body, and ensure that impedance changes of the data signal in the transmission path will be reduced, and the number of the impedance discontinuity points will be reduced.

In some embodiments, the width of the connection terminal 211 is half of the width of the corresponding data signal line pin in the first row of edge connector pins 11. Through optimization of simulation modeling and experiments, the width of the connection terminal 211 is set to be half of the width of the corresponding data signal line pin in the first row of edge connector pins 11, that is, W2 in FIG. 9 is set to be half of W1 in FIG. 8. Such setting can ensure a minimum number of impedance discontinuity points, and a minimum return loss during signal transmission process.

In some embodiments, to facilitate manufacturing and assembly of the circuit board 100, a shape of the connection terminal 211 is set to be the same as that of the corresponding data signal line pin in the first row of edge connector pins 11. Certainly, in actual designs, if a layout space of an inner layer 20 is limited, the shape of the connection terminal 211 may also be set to be different from that of the corresponding data signal line pin in the first row of edge connector pins 11. The connection terminal 211 may be of a rectangular shape or a circular shape. The shape of the connection terminal 211 is not limited in this embodiment, and is not limited to the foregoing examples, either.

In some embodiments of this application, the via 30 may be a blind via. The blind via merely connects the top layer to one inner layer 20, or merely connects the bottom layer to one inner layer 20.

In some embodiments, for ease of provision of the via 30, an extension direction of the via 30 may be perpendicular to a board surface of the circuit board.

In some embodiments, there may alternatively be an inclined angle that is not equal to 90 degrees between the extension direction of the via 30 and the board surface of the circuit board. Moreover, the provided vias 30 preferably have a uniform inner diameter and have relatively few bending points, so as to reduce energy loss during the signal transmission process and avoid signal reflection, thereby improving signal transmission efficiency and signal integrity.

In some embodiments of this application, to facilitate transmission of data signals, a reference backflow layer, that is, a reference layer, is further provided below the edge connector.

As shown in FIG. 13 and FIG. 14, in the optical module provided in the embodiments of this application, the circuit board 100 with a multi-layer plate-like structure includes two surface layers 10 that are respectively provided at two opposite surfaces of the circuit board body and inner layers provided between the two surface layers.

In some embodiments, one of the surface layers 10 is a top layer of the circuit board 100, on which an edge connector is disposed. One of the inner layers may be set as a reference layer 102, and the inner layer(s) sandwiched between the top layer and the reference layer 102 is referred to as an "intermediate layer" 101.

In some embodiments of this application, in a projection region formed by projecting at least one edge connector pin onto the intermediate layer, the intermediate layer is hollowed to form a hollow region. In other words, metal in this region is etched to form a non-conductive region.

In some embodiments of this application, in a projection region formed by projecting a data signal line pin in the edge connector onto the intermediate layer, the intermediate layer is hollowed to form a hollow region. In other words, metal in this region is etched to form a non-conductive region.

In some embodiments of this application, except data signal line pins, hollowing processing is not performed at a projection region formed by projecting another edge connector pin that does not correspond to a data signal line onto the intermediate layer. For example, Projection regions of a power cable pin, an electrical wire pin, and the like will not be hollowed.

In some embodiments of this application, the edge connector includes a first row of edge connector pins and a second row of edge connector pins. In a projection region formed by projecting the data signal line pin in each row of edge connector pins onto the intermediate layer, the inner (intermediate) layer is hollowed to form a hollow region. In other words, metal at this part/region is etched to form a non-conductive region.

Due to the hollowing design on the intermediate layer below the data signal line pins of the edge connector pins, a current backflow of the data signal line pins will not take place through the hollowed inner layer, rather, current backflow of the data signal line pins will take place through the reference layer (which is located below the hollowed inner layer) that forms reference with respect to the data signal line pins. Hence, a distance between the data signal line pin and the reference layer may be increased under the precondition that the impedance matching effects are satisfied. In this way, limitations brought by a relatively small thickness of the circuit board may be mitigated, which is advantageous for improving an impedance matching effect of a data signal. The transmission quality of the data signal may be improved by improving the impedance matching effects.

In some embodiments, it is also possible to set a bottom layer of the circuit board 100 as the reference layer.

According to some embodiments of this application, as shown in FIG. 13, the reference layer 102 herein is an inner board of a multi-layer board. The corresponding intermediate layers 101 include two inner layers. Certainly, the intermediate layers 101 may also have a structure provided with other number of layers. The number of layers of intermediate layer 101 is not limited in the embodiments of this application. The reference layer 102 is a reference backflow layer that is provided for achieving high-speed transmission of the data signal and forms reference with respect to the surface layer 10. Both the intermediate layers 101 and the reference layer 102 are metal layers, with insulation dielectric layers being disposed therebetween.

A first row of edge connector pins 11 and a second row of edge connector pins 12 are provided at a surface of the top layer, where the first row of edge connector pins 11 are closer to an edge of the circuit board 100 as compared with the second row of edge connector pins 12. In projection regions formed by projecting the data signal line pin in each edge connector pin of the edge connector onto respective intermediate layers 101, the intermediate layers 101 are hollowed to form hollow regions 103. Because the projection regions that are formed below the data signal line pins and are provided at the intermediate layer 101 are hollowed, hollow regions 103 are formed between the surface layer 10 and the reference layers 102. The hollow regions 103 render that current backflow of the data signal line pins does not take place through the intermediate layer 101, but through the reference layer 102 that forms reference with respect to the data signal line pin; this helps improve the impedance matching effects of the data signal.

Due to formation of the hollow regions 103, current backflow of the data signal line pins do not take place through a closest layer, but through a reference layer 102 that is relatively farther away. Therefore, a distance between the second row of edge connector pins 12 and the reference layer 102 may be increased under the precondition that the impedance matching effects are satisfied. In this way, limitations brought by a relatively small thickness of the circuit board 100 are reduced, which is helpful for improving the impedance matching effects of a data signal.

In the optical module provided in some embodiments of this application, an area of the hollow region 103 is greater than or equal to an area of the projection region that is formed by projecting the respective data signal line pin onto the intermediate layer 101. Compared with a case in which the area of the hollow region 103 is smaller than the area of the projection region formed by projecting respective data signal line pin onto the intermediate layer 101, a signal from a data signal line 104 may be easily detected for the optical module thus formed.

In the optical module provided in some embodiments of this application, line connections between the multi-layered PCB boards are achieved through vias 30, so as to facilitate signal transmission.

In some embodiments of this application, the via is a metallized via.

In some embodiments of this application, the circuit board is provided with vias to electrically connect the surface layer 10 and the reference layer 102. These vias pass through the intermediate layer 101, and are not electrically connected to the intermediate layer 101.

In the optical module provided in some embodiments of this application, the intermediate layer 101 is further provided with a data signal connection line 104. The first row of edge connector pins 11 are connected to the data signal connection line 104 through the vias. To be specific, an electrical connection between the surface layer 10 and the intermediate layer 101 of the circuit board 100 is achieved through other vias 30.

In this case, a reference ground line 105 is provided between the data signal connection line 104 and the hollow regions 103 beneath the second row of edge connector pins 12, as shown in FIG. 14. Since a reference ground line 105 is remained between the hollow regions 103 and the data signal connection line 104, impedance discontinuity points on a signal path that is formed by the data signal connection line 104 are reduced, and a GSSG modeling of data signal may be conformed to. Hence, the data signal connection line 104 may provide a good signal integrity. Since both the edge connector and the data signal connection line 104 have good signal integrity, signal integrity of the overall communication channel of the optical module can be ensured, so that quality of the data signal through the optical module is improved.

In addition, for example, refer to FIG. 15, in an intermediate layer 101 provided with data signal connection lines, connection terminals corresponding to the data signal connection lines are provided in hollow regions below the first row of edge connector pins 11. The connection terminal, together with, for example, the data signal connection line 104, is connected to the data signal line pin at the surface layer through the vias, so as to ensure a connection/signal transmission between the surface layer 10 and the intermediate layer 101. To be specific, since tracing/wiring is required on the intermediate layer, the hollowed region is not completely etched; rather, connection terminals correspondingly connected to respective data signal connection line are remained/unetched. That is, a region, of the intermediate layer, that corresponds to the data signal line pin in the first row of edge connector pins 11 is a hollow region, and connection terminals correspondingly connected to respective data signal connection lines on the intermediate layer 101 are remained/provided in the hollow region. Preferably, a length of the connection terminal is smaller than that of the corresponding data signal line pin in the first row of edge connector pins 11. Preferably, an area of the connection terminal is smaller than an area of other rest parts of the hollow region.

In some embodiments of this application, at each intermediate layer 101, data signal connection lines 104 are provided between two adjacent hollow regions 103. Hollow regions 103 are provided at both sides of a data signal connection line 104, and a reference ground line 105 is provided between the hollow region 103 and the data signal connection line 104. Because the hollow regions 103 are provided at both sides of the data signal connection line 104, and the reference ground line 105 is provided between the hollow region 103 and the data signal connection line 104, a signal path thus formed by the data signal connection line 104 does not have impedance discontinuity points, and a GSSG modeling of data signal may be conformed to. Thus, the data signal connection line 104 is further provided with a good signal integrity.

In some embodiments of this application, inner-layer connection lines are provided on an intermediate layer. An end portion, of the via, that is located at the inner layer is electrically connected to the inner-layer connection line, so as to transmit the signal from the surface layer to the inner-layer connection line 21 through the first row of edge connector pins and the via. The inner-layer connection line is connected to the via through the connection terminal at the intermediate layer; and an end portion, of the via, that is located at the intermediate layer is connected to the connection terminal. The connection terminal is disposed to be close to an end portion, of the circuit board, that is provided with the first row of edge connector pins 11.

In some embodiments of this application, the circuit board is an eight-layer board, wherein the two middlemost layers of circuit boards are designated as reference layers, and two intermediate layers are provided between each reference layer and the corresponding surface layer.

In some embodiments of this application, the circuit board is a ten-layer board, wherein two middlemost layers of circuit boards are designated as reference layers, and three intermediate layers are provided between each reference layer and the corresponding surface layer.

In the embodiments of this application, a data signal pin in the first row of edge connector pins 11 is connected to the second laser chip in the laser chips 201, so that an electrical signal is transmitted to the second laser chip through the data signal pin in the first row of edge connector pins 11, such that the electrical signal may be converted into an optical signal for the second laser.

In the optical module provided in some embodiments of this application, by hollowing the projection region that is formed by projecting a data signal pin in the second row of edge connector pins onto the intermediate layer, a current backflow of the data signal pin in the second row of edge connector pins will not take place through the intermediate layer, rather, a current backflow will take place through the reference layer that forms reference with respect to the data signal pin in the second row of edge connector pins; this helps to improve the impedance matching effects of the data signal. In addition, formation of the hollow region and provision of the reference ground line between the hollow region and the data signal connection line prevent impedance discontinuity points from arising along the signal path formed by the data signal connection line, with a GSSG modeling of data signal being conformed to. Thus, the data signal connection line may provide a good signal integrity. Since both the edge connector and the data signal connection line have good signal integrity, signal integrity of the overall communication channel of the optical module can be ensured, so that quality of the data signal through the optical module is improved.

Obviously, features in the embodiments described with reference to the accompanying drawings may act independently, or may be combined with each other.

In the description of this application, it should be understood that orientation or position relationships indicated by the terms such as "on", "below", "front", "back", "vertical", "horizontal", "top", "bottom", "inside", and "outside" are based on orientation or position relationships shown in the accompanying drawings, and are used only for ease and brevity of describing this application, rather than indicating or implying that the mentioned apparatus or components must have a particular orientation or must be constructed and operated in a particular orientation. Therefore, such terms should not be construed as limiting this application. In the description of this application, unless otherwise exactly and specifically defined, "a plurality of" means two or more than two.

The terms such as "first", "second", "third", and "fourth" (if exist) in the specification, claims, and accompanying drawings of this application are used to distinguish similar objects, and are not necessarily used to describe a particular sequence or a sequential order. It should be understood that data used in this way can be converted in suitable cases, so that the embodiments of this application that are described herein can, for example, be implemented in a sequence other than the sequences shown in the figures or described herein. In addition, the terms "including", "comprising", and any variants thereof are intended to cover a non-exclusive inclusion. For example, a process, a method, a system, a product, or a device that includes a series of steps or units is not limited to listed steps or units, but may further include a step or unit that is not clearly listed, or another inherent step or unit of the process, the method, the product, or the device.

Finally, it should be noted that the foregoing embodiments are merely intended to describe the technical solutions of this application, and shall not be construed as limitation. Although this application is described in detail with reference to the foregoing embodiments, one of ordinary skills in the art may understand that modifications still may be made to the technical solutions disclosed in the foregoing embodiments, or equivalent replacements may be made to some or all of the technical features. However, these modifications or equivalent replacements do not deviate the nature of corresponding technique solutions from the scope of the technique solutions of the embodiments of this application.

What is claimed is:

1. An optical module, comprising:
a first laser chip and a first laser, the first laser chip being configured to drive the first laser;

a second laser chip and a second laser, the second laser chip being configured to drive the second laser; and a multi-layer circuit board, comprising a surface layer, a reference layer, and an intermediate layer provided between the surface layer and the reference layer, wherein a first row of edge connector pins and a second row of edge connector pins are disposed in the surface layer;

the first row of edge connector pins are disposed to be closer than the second row of edge connector pins to a side edge, of the multi-layer circuit board, that is provided with an edge connector; and a region, of the intermediate layer, that corresponds to a data signal line pin in the second row of edge connector pins is a hollow region;

wherein a data signal connection line is provided on the intermediate layer, and a reference ground line is provided between the hollow region and the data signal connection.

2. The optical module according to claim 1, wherein an area of the hollow region is greater than or equal to an area of the corresponding second row of edge connector pins.

3. The optical module according to claim 1, wherein hollow regions are provided at both sides of at least one data signal connection line, and a reference ground line is provided between each hollow region and the at least one data signal line.

4. The optical module according to claim 1, wherein the surface layer of the multi-layer circuit board is connected to the intermediate layer and the reference layer through vias.

5. The optical module according to claim 4, wherein the via for connecting the surface layer and the reference layer passes through the intermediate layer, but is not electrically connected with the intermediate layer.

6. The optical module according to claim 4, wherein the vias are disposed at intervals along an extension direction of an edge connector pin.

7. The optical module according to claim 1, wherein the intermediate layer is provided with a data signal connection line and a corresponding connection terminal connected to the data signal connection line, the data signal connection line is connected to a via through the connection terminal, and a width of the connection terminal is greater than that of the data signal connection line.

8. The optical module according to claim 7, wherein the data signal connection line on the intermediate layer is electrically connected to a data signal line pin in the first row of edge connector pins.

9. The optical module according to claim 8, wherein a shape of the connection terminal is the same as that of the corresponding data signal line pin in the first row of edge connector pins.

10. The optical module according to claim 8, wherein a region, of the intermediate layer, that corresponds to a data signal line pin in the first row of edge connector pins is a hollow region, and the connection terminal is arranged in the hollow region.

11. The optical module according to claim 10, wherein a length of the connection terminal is smaller than that of the corresponding data signal line pin in the first row of edge connector pins.

12. The optical module according to claim 7, wherein a width of the connection terminal is greater than or equal to $\frac{1}{3}$ of a width of the corresponding data signal line pin in the first row of edge connector pins, and is smaller than or equal to the width of the corresponding data signal line pin in the first row of edge connector pins.

13. The optical module according to claim 12, wherein the width of the connection terminal is half of the width of the corresponding data signal line pin in the first row of edge connector pins.

14. The optical module according to claim 10, wherein an area of the connection terminal is smaller than an area of the rest of the hollow region.

15. The optical module according to claim 1, wherein in the multi-layer circuit board, two middlemost layers of circuit boards are designated as reference layers.

16. The optical module according to claim 1, the circuit board is an eight-layer board, two middlemost layers of circuit boards are designated as reference layers, and two intermediate layers are provided between each reference layer and the corresponding surface layer.

17. The optical module according to claim 1, wherein the circuit board is a ten-layer board, two middlemost layers of circuit boards are designated as reference layers, and three intermediate layers are provided between each reference layer and the surface layer.

18. The optical module according to claim 1, wherein a region, of the intermediate layer, that corresponds to a data signal line pin in the first row of edge connector pins is a hollow region.

* * * * *